(12) United States Patent
Bychkov et al.

(10) Patent No.: US 7,973,737 B2
(45) Date of Patent: Jul. 5, 2011

(54) STORAGE DEVICE WITH ILLUMINATED PANEL

(75) Inventors: Eyal Bychkov, Hod Hasharon (IL); Yohan Cohen, Hod Hasharon (IL)

(73) Assignee: SanDisk IL Ltd., Kfar Saba (IL)

( * ) Notice: Subject to any disclaimer, the term of this patent is extended or adjusted under 35 U.S.C. 154(b) by 816 days.

(21) Appl. No.: 11/400,172

(22) Filed: Apr. 10, 2006

(65) Prior Publication Data

US 2006/0227123 A1     Oct. 12, 2006

Related U.S. Application Data

(60) Provisional application No. 60/669,790, filed on Apr. 11, 2005.

(51) Int. Cl.
*G09G 5/00* (2006.01)
(52) U.S. Cl. ......................................... 345/1.1; 345/156
(58) Field of Classification Search ................... 345/1.1, 345/156; 455/575.3
See application file for complete search history.

(56) References Cited

U.S. PATENT DOCUMENTS

| | | | | |
|---|---|---|---|---|
| 6,360,954 B1 * | 3/2002 | Barnardo | ...................... | 235/492 |
| 6,710,753 B2 * | 3/2004 | Gillespie et al. | ................ | 345/2.1 |
| 6,992,672 B1 * | 1/2006 | Niikawa et al. | ................ | 345/530 |
| 7,249,324 B2 * | 7/2007 | Nakamura et al. | ............ | 715/776 |
| 7,283,353 B1 * | 10/2007 | Jordan et al. | .............. | 361/679.27 |
| 2003/0067416 A1 * | 4/2003 | Kim | ................................. | 345/1.1 |
| 2003/0160771 A1 | 8/2003 | Fraser et al. | | |
| 2004/0050942 A1 * | 3/2004 | Ueda et al. | ..................... | 235/492 |
| 2004/0072589 A1 * | 4/2004 | Hamamura et al. | ........ | 455/550.1 |
| 2004/0119679 A1 * | 6/2004 | Garcia et al. | .................. | 345/102 |
| 2004/0155833 A1 * | 8/2004 | Ishii et al. | ....................... | 345/1.1 |
| 2004/0202052 A1 | 10/2004 | Lev | | |
| 2005/0184952 A1 * | 8/2005 | Konno et al. | .................. | 345/102 |
| 2005/0200559 A1 * | 9/2005 | Koyama et al. | ................ | 345/1.1 |
| 2007/0194885 A1 * | 8/2007 | Lindgren et al. | ............. | 340/5.91 |

* cited by examiner

*Primary Examiner* — Kevin M Nguyen
*Assistant Examiner* — Jonathan Boyd
(74) *Attorney, Agent, or Firm* — Vierra Magen Marcus & DeNiro LLP

(57) ABSTRACT

Different peripheral devices of the present invention include: a display panel interface to which is reversibly operationally attachable a display panel and a power interface for receiving power from a host; a display panel to which are individually reversibly operationally attachable display panels for displaying respective aspects of the device's operation; a display panel for providing a semantic display of the device's mode of operation and a power interface for receiving power from a host; or a display panel, a controller for operating the display panel in accordance with ambient conditions, and a power interface for receiving power from a host. A system includes an appliance, an ornament dock and a peripheral device, reversibly operationally attachable to either the appliance or the ornament dock, that operates a display panel in accordance with data received from the appliance.

10 Claims, 7 Drawing Sheets

Place screen on top connector

Place screen on side connector

STORAGE DEVICE WITH ILLUMINATED PANEL

This patent application claims the benefit of U.S. Provisional Patent Application No. 60/669,790, filed Apr. 11, 2005

FIELD AND BACKGROUND OF THE INVENTION

The present invention relates to computer peripherals, and in particular to a portable storage device that includes a display.

The last few years have brought a great rise in the popularity of portable mass storage devices. These devices follow a variety of forms and standards but usually share some common features. It is according to the following features that the term "portable mass storage device" and "portable storage device" will henceforth be defined: 1) it contains a non-volatile storage unit, 2) it allows for the storage of large amounts of data, typically in the megabyte or gigabyte range 3) it is operatively and reversibly connectable to an electronic appliance, 4) it is energized by a host electronic appliance and has no independent self-powering capabilities such as batteries, and 5) it is pocketable, in the sense that a user can easily carry the device on his or her own person. A portable mass storage device may be implemented in a number of ways ranging from a memory card for storing digital image files to a USB flash drive operatively connectable to a computer.

Referring now to the drawings, FIG. 1 is a simplified block diagram of a standard portable storage device 100 of the prior art connected to an appliance 150. Portable storage device 100 contains a storage unit 120 for storing digital data. Storage unit 120 is a non-volatile memory that allows the writing, reading, and erasing of data. A controller 115 is used for regulating the flow of data to and from storage unit 120 and for logically interconnecting the different components of portable storage device 100. A power interface 105 receives electrical power for operating the various components of storage device 100. Device 100 also includes a data interface 110 that manages data exchange between controller 115 and appliance 150. A display unit 125 is electronically controlled by controller 115, and is commonly used to give a visual indication of the operation status of portable storage device 100, for example: to indicate whether device 100 is energized, or in the case that device 100 supports more than one communication standard, which communication standard is being used. Controller 115 uses its computational resources to determine the status of device 100, for example to determine whether device 100 is energized, and signals to display unit 125 to give a visual indication of that status. Display unit 125 typically utilizes light emitting diodes (LED) as its primary display technology. Display unit 125 typically consists of one or two LED segments in a simple configuration and in a narrow range of colors, thus, the ability of display unit 125 to exhibit complex visual indications is limited. For example, if a USB flash drive can communicate with a host device using one of two communication standards, prior art display units would indicate the use of a first communication standard by lighting a LED lamp in a first color, and indicate the use of a second communication standard by lighting a LED lamp in a second color. This kind of visual indication is non-intuitive and often misunderstood by users. The information displayed by display unit 125 is also regularly state-based and not quantity or quality oriented. Appliance 150, is a device that is reversibly operatively connectable to portable storage device 100, for example a digital camera or a computer. Appliance 150 is operative to implement a number of functions 168. For example, if appliance 150 is a digital camera its function 168 include the digital recording of visual images. In order for a data exchange between portable storage device 100 and appliance 150 to take place, an electrical power link 166 and a data link 167 have to be established. Electrical power link 166 connects a power supply 155 of appliance 150 to a power interface 105 of storage device 100 in a way which energizes storage device 100. Data link 167 connects a data interface 165 of appliance 150 with a data interface 110 of portable storage device 100. It should be noted that in many cases, as in the case of USB connectors frequently used in portable storage devices, electrical power link 166 and data link 167 form part of the same connector. Having established links 166 and 167, portable storage device 100 is generally operable, meaning that portable storage device 100 can perform its general purpose of reading, writing and erasing data packages. For example, appliance 150 may read information stored on storage unit 120, or data originating from appliance 150 may be written to storage unit 120.

In addition to LED, there are other display technologies known in the art. Among these display technologies the dominant ones are Liquid Crystal Display (LCD) and Electro-Luminescent elements (EL). These technologies, along with a more complex configuration of LED lamps, can achieve a better visual representation of information than the single/dual LED segment display that is regularly used in portable storage devices. However, these technologies are not presently being used in portable storage devices.

Electronic ornaments are an up-and-coming trend in the world of fashion and technology-based apparel. An electronic ornament is a wearable device that includes a display unit that can emit programmable visual signals that achieve an eye-pleasing effect. Wearable electronic devices that do not produce programmable eye-pleasing visual signal when worn are not considered electronic ornaments herein. An electronic ornament may be a single-purpose dedicated device such as a wrist-watch or pendant exhibiting a predetermined visual pattern. More-advanced electronic ornaments also allow for the updating of the visual display by including optional connectivity to an external device. The Nokia Medallion produced by Nokia Group, Espoo, Finland is an example of an advanced prior art electronic ornament. The ornament displays a digital image and is also connectable through infrared communication to a cellular phone for uploading digital images to the ornament. Thus, the displayed image may be replaced and updated. The miniaturization of common hand-held devices such as digital cameras and cellular phones further challenges the definitions of electronic ornaments, for these devices are becoming compact enough to be wearable and also regularly include means of display. Yet, none of these devices falls under the aforementioned definition of portable storage devices. An electronic ornament's basic requirement for an on-board portable electrical power source as a condition for operation, and the lack of such a power source in portable storage devices, has lead to the fact that portable storage devices are not usable as electronic ornaments. It should be noted that electronic ornaments usually utilize the same display technology (LED) that currently is used in the portable storage device arena as display units 125, as well as the technologies. (LCD, EL) mentioned above that currently are not used in portable storage devices as display units 125.

Considering the possibility of enhancing the information displayed by a portable mass storage device, by using display technologies other than just LED, and the growing popularity of electronic ornaments, it would be advantageous to have a portable storage device with enhanced display capabilities that can also double as an electronic ornament.

SUMMARY OF THE INVENTION

It is an object of the present invention to provide an improved portable storage device by including in the device an enhanced display unit that adds two main novel features: allowing the visual display of complex types of information in an intuitive manner, and allowing the storage device to function as an electronic ornament.

It is a further object of the present invention to increase the number of possible display patterns, designs and colors of the display unit by making the display panel of the display unit detachable and interchangeable. Moreover, it is an object of the present invention to further diversify the visual effects of the display unit by allowing a choice among a number of flashing sequences.

Another object of the present invention is to provide means for the electro-visual display of the function or content of a storage device. The display unit portrays the content or function of the device, thus allowing the user to view/exhibit this content or function, a feature which may be desirable to the user, while creating a publicity opportunity for manufacturers.

Therefore, according to the present invention there is provided a peripheral device including: (a) a display panel interface; (b) a display panel that is reversibly operationally attachable to the display panel interface; and (c) a power interface for receiving power, from a host of the peripheral device, for powering the display panel via the display panel interface.

Furthermore, according to the present invention there is provided a peripheral device including: (a) a display panel interface; and (b) a plurality of display panels that are individually reversibly operationally attachable to the display panel interface, each display panel being operative to display only a respective aspect of operation of the peripheral device.

Furthermore, according to the present invention there is provided a system including: (a) an appliance that includes: (i) an appliance power supply, and (ii) an appliance data interface; (b) an ornament dock that is separate from the appliance and that includes an ornament dock power supply; and (c) a peripheral device, that is alternately reversibly operationally attachable to the appliance and to the ornament dock, and that includes: (i) a display panel, (ii) a peripheral data interface for receiving data from the appliance, a mode of operation of the display panel then being in accordance with the data, and (iii) a power interface for receiving power for the display panel: (A) from the appliance power supply when the peripheral device is operationally attached to the appliance, and (B) from the ornament dock power supply when the peripheral device is operationally attached to the ornament dock.

Furthermore, according to the present invention there is provided a peripheral device, including: (a) a display panel for providing a semantic display of a mode of operation of the peripheral device; and (b) a power interface for receiving power for the display panel from a host to which the peripheral device is reversibly operationally attached.

Furthermore, according to the present invention there is provided a peripheral device, including: (a) a display panel; (b) a controller for operating the display panel in accordance with ambient conditions; and (c) a power interface for receiving power for the display panel and for the controller from a host to which the peripheral device is reversibly operationally attached.

Furthermore, according to the present invention there is provided a method of labeling a peripheral device, including the steps of: (a) operationally attaching a display panel to the peripheral device; and (b) displaying a label on the display panel responsive to data stored in the peripheral device.

Furthermore, according to the present invention there is provided a peripheral device including: (a) a housing; and (b) a plurality of display panel interfaces on an exterior surface of the housing for reversibly attaching a display panel to the peripheral device.

A first basic aspect of the present invention is a peripheral device that includes a display panel interface, a display panel that is reversibly operationally attachable to the display panel interface. As understood herein, a "peripheral device" is a device intended to be used in conjunction with a host device. The examples of preferred "peripheral devices" that are discussed below all are portable data storage devices that are used in conjunction with hosts such as personal computers and digital cameras.

The basic peripheral device also includes a power interface for receiving power from the host. The power is for powering the display panel via the display panel interface. Preferably, the peripheral device also includes a mechanism for toggling between a first state in which the display panel receives power via the display panel interface and a second state in which the display panel does not receive power via the display panel interface.

Preferably, the peripheral device also includes a controller for setting the mode of operation of the display panel.

Preferably, the peripheral device also includes a data interface for exchanging data with the host and a non-volatile memory for storing the data. All the peripheral devices discussed below include such data interfaces and such a non-volatile memories.

A second basic aspect of the present invention is a peripheral device that includes a display panel interface and a plurality of interchangeable display panels. Each display panel is individually reversibly operationally attachable to the display panel interface, and is operative to display only a respective aspect of the operation of the peripheral device. For example, one display panel of a portable data storage device may display only the free storage space available while another display panel of the data storage device displays only the direction of data exchange with the host.

Fraser et al., in U.S. Patent Application Publication No. 2003/0160771, teaches a handheld computing device that includes a processing unit and a detachable visual display unit. Unlike the first basic aspect of the present invention, the device of Fraser et al., being independently operable, does not include a power interface for receiving power from a host. Unlike the second basic aspect of the present invention, the device of Fraser et al. has only one kind of detachable display panel, and not a set of display panels, each of which is dedicated to a specific type of display.

A third basic aspect of the present invention is a system that includes an appliance, an ornament dock that is separate from the appliance, and a peripheral device. The appliance includes an appliance power supply and an appliance data interface. The ornament dock includes an ornament dock power supply. The peripheral device is alternately reversibly operationally attachable to either the appliance or the ornament dock. The peripheral device includes a display panel, a peripheral data interface for receiving data from the appliance and a power interface for receiving power for the display panel. The mode of operation of the display panel is set in accordance with the data received from the appliance. The power is received from the appliance power supply when the peripheral device is operationally attached to the appliance and from the ornament dock power supply when the peripheral device is operationally attached to the ornament dock.

Preferably, the peripheral device also includes a non-volatile memory for storing the data.

Lev, in U.S. Patent Application Publication No. 2004/0202052, teaches a cellular telephone that serves as both an appliance and an ornament. Unlike the third basic aspect of the present invention, in which the ornament dock is separate from the appliance, the cellular telephone of Lev has an integral ornament dock.

A fourth basic aspect of the present invention is a peripheral device that includes a display panel for providing a semantic display of the mode of operation of the peripheral device and a power interface for receiving power for the display panel from a host to which the peripheral device is reversibly operationally attached. That the display is a "semantic" display means that the form of the display is related to the meaning of the display. This is as opposed to e.g. the prior art LED displays discussed above, in which different colors are given arbitrary meanings. Preferred examples of semantic displays include iconic displays and textual displays.

Preferably, the peripheral device also includes a data interface for exchanging data with the host and a non-volatile memory for storing the data. Most preferably, the mode of operation that is displayed semantically is a mode of interaction of the peripheral device with the host, for example a security level of the exchange of data with the host or a direction of the exchange of data with the host. Alternatively, the mode of operation that is displayed semantically is an occupancy of the non-volatile memory, i.e. how much of the non-volatile memory is occupied by the data.

A fifth basic aspect of the present invention is a peripheral device that includes a display panel, a controller for operating the display panel in accordance with ambient conditions, and a power interface for receiving power for the display panel and for the controller from a host to which the peripheral device is reversibly operationally attached.

Preferably, the peripheral device also includes a sensor such as a sensor of ambient light intensity or a motion sensor.

Preferably, the ambient conditions include the level of the power provided to the peripheral device by the host via the power interface.

Preferably, the peripheral device also includes a data interface for exchanging data with the host and a non-volatile memory for storing the data.

A sixth basic aspect of the present invention is a method of labeling a peripheral device. A display panel is operationally attached to the peripheral device and a label is displayed on the display panel responsive to data stored in the peripheral device. Preferably, the display panel is reversibly operationally attached to the peripheral device.

A seventh basic aspect of the present invention is a peripheral device that includes a housing and a plurality of display panel interfaces, on an exterior surface of the hosing, for reversibly attaching a display panel to the peripheral device. Preferably, each display panel interface faces in a different respective direction.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a portable peripheral device, such as a portable storage device, that has an enhanced display, and a method of operation thereof. The principles and operation of a portable peripheral device according to the present invention may be better understood with reference to the drawings and the accompanying description.

Figure 1:
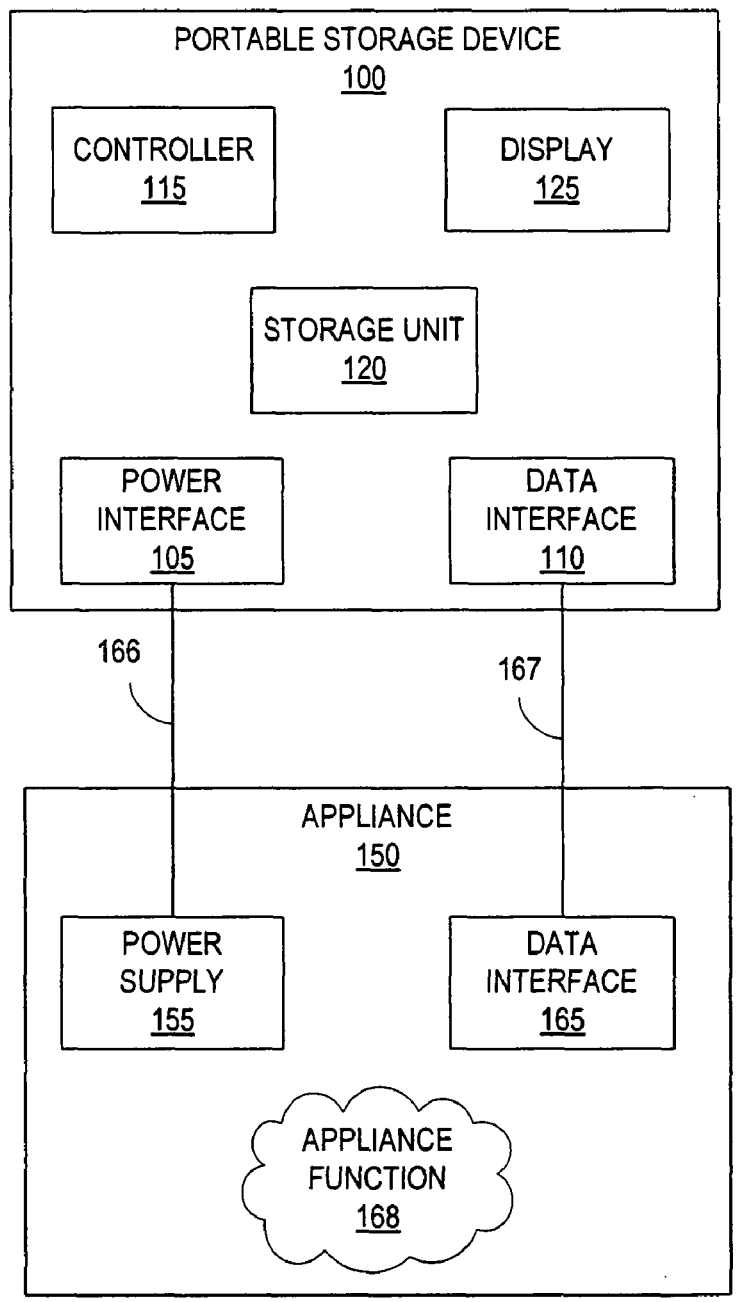
FIG. 1 is a simplified block diagram of a portable storage device of the prior art connected to an appliance.
Figure 2:
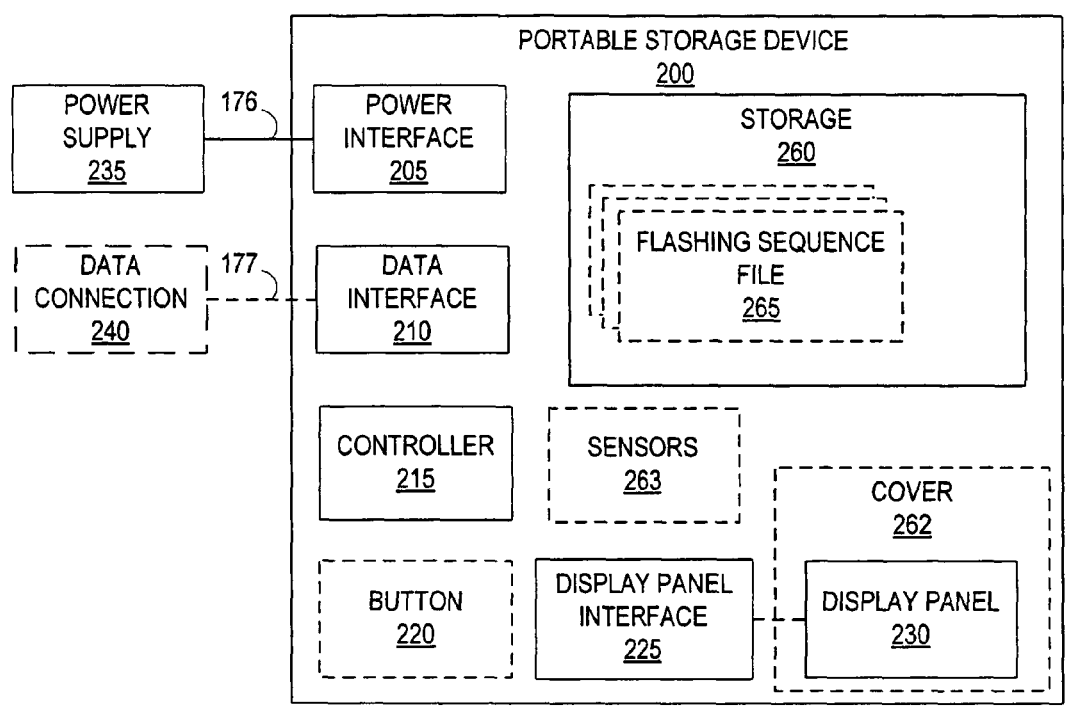
FIG. 2 is a simplified block diagram of a system that includes a preferred portable storage device of the present invention.

Referring again to the drawings, FIG. 2 is a high-level schematic block diagram of a system containing a portable storage device 200 that is constructed and operable in accordance with a preferred embodiment of the present invention. Portable storage device 200 is configured to store data packages in a similar manner to that which has been described above in the prior art. Thus, portable storage device 200 includes a power interface 205, a data interface 210, a controller 215 and a storage unit 260 whose general operation and functionality are similar to the general operation and functionality of corresponding blocks 105, 110, 115, 120 of prior art FIG. 1. In the system described herein portable storage device 200 is energized by a power supply 235 through an electrical power link 176 and power interface 205 in a similar manner to the energizing of portable storage device 100 by power supply 155 through electrical power link 166 and power supply 155 of the prior art. It should be noted that power supply 235 may be a portable power supply such as a battery. An optional data link 177 is established between an optional data connection 240 and data interface 210 in a similar manner to the establishment of data link 167 between data interface 165 and data interface 110 of portable storage device 100. In the system described herein, portable storage device 200, when connected to an external device and having established both data link 177 and power link 176, is generally operable. Yet, portable storage device 200 may also be connected to an external device that does not contain a data interface and still maintain some of its functionalities, in particular the display functionality.

Figure 4A:
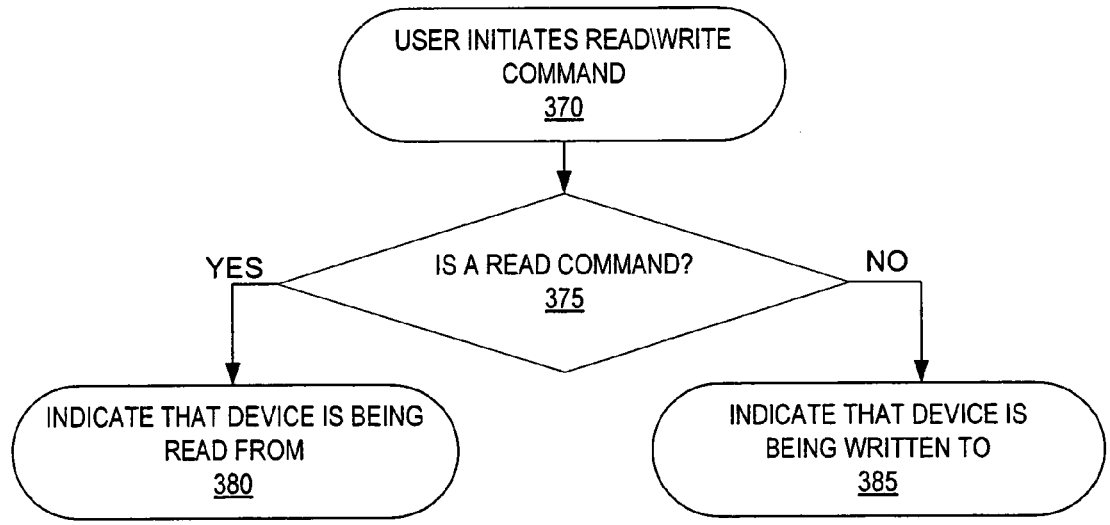
FIG. 4A is a flowchart of the workflow of a data flow direction display feature of the storage device of FIG. 2.
Figure 4B:
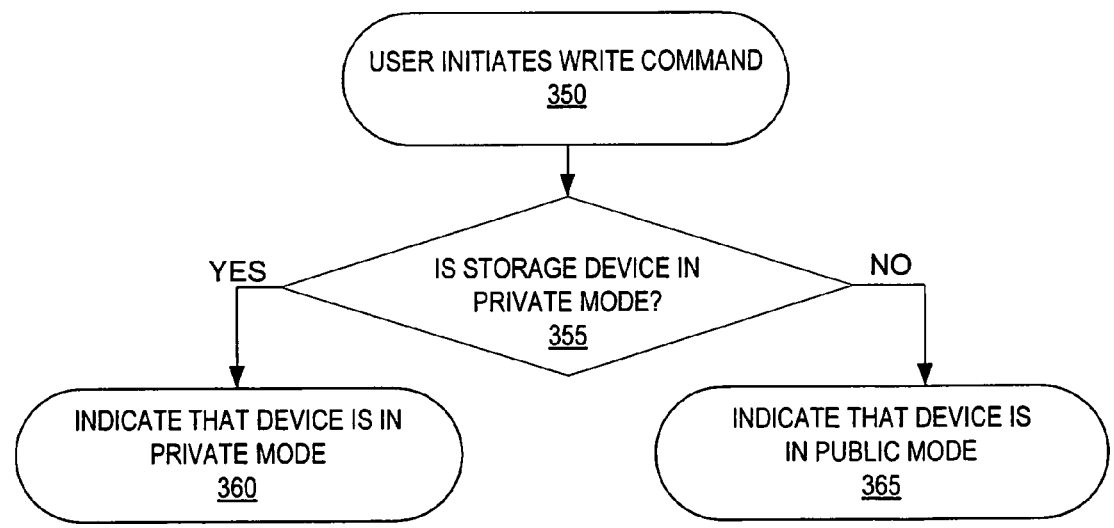
FIG. 4B is a flowchart of the workflow of a write mode display feature of the storage device of FIG. 2.

Portable storage device 200 also includes a display panel 230 that interfaces mechanically and electrically with the rest of portable storage device 200 at a display panel interface 225. Display panel 230 has the capability of translating electrical signals into visual effects. Display panel 230 consists of a number of illuminable segments, set up in accordance with a certain design or drawing, that forms the artwork of display panel 230. Furthermore, the segments may be lighted or remain unlighted, for variable periods of time and at variable light intensities, in accordance with a programmable sequence, which is called herein the "flashing sequence" of display panel 230. By means of example, in one typical exemplary embodiment, the artwork of display panel 230 consists of three illuminable segments, a first segment in the form of a blue circle, a second segment in the form of a green square and a third segment in the form of a red triangle. An exemplary flashing sequence in this particular example is the alternate lighting of the first and third illuminable segments, each lighting interval having a duration of one second, and the lighting of the second illuminable segment every tenth interval for a duration of three seconds. It is clear from the given example that the variety of artworks and flashing sequences is dependant on the creative ingenuity of the designer and on the number of illuminable segments that fit on display panel 230. Using display panel 230, information that has been displayed according to the prior art in a non-intuitive manner may be better represented, furthermore, some types of information, that were impossible to display under the display restrictions set by the display configuration of the prior art, may be displayed using display panel 230. For example, in order to represent whether portable storage device 200 is being read from or written to, the artwork on display panel 230 depicts an arrow that, when illuminated, points in the direction of the data flow. FIG. 4A is a flowchart of a process of visually indicating whether portable storage device 200 is being written to or read from. The user initiates either a read or a write command (step 370) to portable storage device 200. Controller 215, according to whether a read or a write command has been initiated (step 375) gives an instruction to display panel 230 through display panel interface 225 to display whether portable storage device 200 is being read from or written to (steps 380 and 385 accordingly). This kind of display is useful for security reasons: it allows a user to detect uninitiated data transfers as an indication of harmful software attempting to read or write information from/to portable storage device 200. Another example of a security feature is the display of the mode of operation of portable storage device 200, for example in a device having two security modes: private and public. In this example, storage unit 260 is divided logically into two storage areas, one private and one public, with the private storage area being encrypted and password protected. A visual indication notifies the user to which storage area data are being written to. FIG. 4B is a flowchart of a process of visually indicating to the user whether the data are being written to the private or public storage area. The user attempts to write data to portable storage device 200 (step 350). Controller 215, which has already been set to work with private or public mode by the user (not shown), now checks what mode it should operate under (step 355). Controller 215 now gives an instruction to display panel 230 through interface 225 to display whether the device is in private or public mode (steps 360 and 365 accordingly). Thus, the problem of current devices, wherein a user presumes that data are written to the private storage area while it is actually written to the public storage area by mistake, is noticed and avoided by the user. This feature is easily implemented by lighting display panel 230 in a first color, green, to show that data are being written to the public storage area, and lighting display panel 230 in a second color, red when data are written to the private storage area. Other visual indications such as a depiction of a lock indicating a secure mode or an appropriate textual message are also possible. Yet another example is the depiction of the amount of storage space that is left on storage unit 260, which may be represented using an advancing bar, a pie-chart or a number depicting the percentage of space used.

In some cases, as in the case of the EL technology, the artwork of display panel 230 may be seen even when the segments are not illuminated and portable storage device 200 is not energized. Display panel 230 has electric wiring and contact regions that are configured so that display panel 230 may be electronically connected to display panel interface 225. Hence, given a wire configuration of panel interface 225, any display panel 230 having a matching wiring configuration may be coupled with panel interface 225. Display panel 230 is optionally removable from display panel interface 225. Thus, different removable display panels 230 may be interchangeably coupled with a given display panel interface 225, provided that these display panels 230 and display panel interface 225 have matching wiring configuration. A detachable display panel 230 enables the user to diversify the visual display capabilities of portable storage device 200. For example, a first detachable display panel 230 allows the display of information regarding the amount of free storage space available on portable storage device 200. The user may decide that a display panel 230 displaying the direction of data communication may be more relevant and so by simply switching display panels 230 and ensuring that controller 215 operates under an instruction set appropriate to the display panel 230 presently connected to display panel interface 225, the desired data will subsequently be displayed. The instruction set for each display panel 230 either is programmed into controller 215, as part of a library of instruction sets for a collection of display panels 230 of diverse types, or is embedded in display panel 230 and is read from display panel 230 by controller 215 via display panel interface 225. Another example for the practical use of a detachable panel becomes evident when considering that manufacturers may improve display technologies and artwork supported as time advances. Using detachable display panels 230, users may upgrade their display capabilities without the need to purchase new portable storage devices 200. A detachable display panel 230 may also present itself as a marketing opportunity for storage device related merchandise, examples of which include digital cameras that use portable storage devices 200 for storing images and video games and video game consoles that use portable storage devices 200 as means for storing "saved games". A manufacturer of such storage-device-related merchandise may market the merchandise together with a detachable display panel 230 that includes artwork that operates in congruence with the merchandise. Such a display panel 230 thus either adds to the functionality of the merchandise or visually exhibits the user's possession of the merchandise. For example, a gaming manufacturer may decide to merchandise a video game with a detachable display panel 230, with the artwork of display panel 230 including the game's logo. The user may attach such a detachable display panel 230 to a portable storage device 200, thus displaying the possession of the game. Further expanding the previous example, a display panel 230 that has been manufactured by the gaming manufacturer can display game achievements. For example if display panel 230 is attached to a portable storage device 200 which is used to store "saved games" relating to a game that this display panel 230 has been manufactured with, this display panel 230 could display the score reached by the user, could give a visual representation of the level reached by the user, etc., using the games saved on portable storage device 200 as a source of information. Another example of the use of a detachable display panel 230 working in congruence with the data stored on portable storage device 200 presents itself as a means for differentiating between different portable storage devices 200. As portable mass storage devices are becoming more common and their price continues to drop, users may own more than one such device. The ability to use the display to distinguish one device from the other based on the contents of the device is advantageous over the old methods of distinguishing between devices by permanent physical features such as stickers. Controller 215 may analyze storage unit 260 for different file-types and light file-type icons appearing on display panel 230 according to the file-types identified.

Portable storage device 200 may be positioned in several orientations in relation to appliance 150, as is the case of a standard USB connection between appliance 150 and portable storage device 200. The USB receptacle connector of appliance 150 may be positioned in one of four possible alignments, rotated by 90 degrees with respect to each other, and the user, inserting the USB plug of portable storage device 200 into the receptacle, may find that display panel 230 cannot be seen because display panel 230 is facing down. Portable storage device 200 preferably allows multiple positioning of display panel 230, selectable according to the orientation of insertion of portable storage device 200 into the receptacle connector of appliance 150. The user may thus choose a position that allows display panel 230 to be viewed. In order to achieve this goal, portable storage device 200 preferably includes several panel interfaces 225 positioned in different location on the device body.

Interface 225 may be sunken below the level of that which surrounds it and thus display panel 230 may be attached to interface 225 and covered by an optional detachable transparent cover 262, allowing the possibility of replacing display panel 230 while maintaining the integrity of the form factor of portable storage device 200. Cover 262, being transparent, allows the panel to be visible. Optionally, cover 262 may come in several colors, creating combinations of color filters and artwork with display panel 230.

Display panel interface 225 is configured to receive display instructions from controller 215 and to accordingly send electrical signals to display panel 230, dictating which segment is to be lighted, for how long and at what intensity. Controller 215 may be programmed to dictate a flashing sequence of any display panel 230 electrically connected to display panel interface 225. The flashing sequence, in congruence with the artwork of display panel 230, may supply information on the status of portable storage device 200. Otherwise, the artwork may create a non-informatory, eye-pleasing effect. In the case that display panel 230 exhibits status information, such as the amount of free space available in storage unit 260 or the direction of the data flow, controller 215 uses a computer program for determining the status of portable storage device 200, translates this status to a flashing sequence, and transmits the flashing sequence to display panel interface 225, causing the lighting of display panel 230 in the prescribed manner. In the case that display panel 230 is used as a non-informatory, decorative display, controller 215 may use either a predetermined flashing sequence or a computer program that calculates a flashing sequence dependent on a number of parameters. An example of such a computer program is one that determines the flashing sequence according to the day of the week. In the example of the display panel previously mentioned, the flashing sequence on Mondays alternates between the first lighting region and the second lighting region in intervals of one second, and on Tuesdays the flashing sequence alternates between the second lighting region and the third lighting region in intervals of two seconds. A plurality of programs and/or predetermined sequences may be hardwired into controller 215 or be stored as a number of optional flashing sequence files 265 on storage unit 260. Each sequence file 265 is a file including a computer program for determining a flashing sequence, be it status based or non-informatory decorative display based. Each sequence file 265 may also hold an instruction set for a predetermined flashing sequence. It should be noted that two display panels 230, having similar illuminated segments but with different artwork, may be lighted by the same sequence. Thus, a certain flashing sequence may lend itself to several display panels 230.

Controller 215, in a portable storage device 200 having more than one display operation mode, is configured to determine which display option to operate under in accordance with a user command. Alternatively, the display option is determined by controller 215 according to measurable parameters, for example, if data are being written to storage unit 260 the display option is one which exhibits the amount of free storage space available on storage unit 260, if data are not being written the display option is set to flash according to a predetermined sequence. The controller can control electrical characteristics of interface 225, for example voltage and frequency, in order to achieve flexibility in the trade-off between brightness and the lifetime of the display. Thus, display panel 230, using measurable parameters to determine a mode of operation, may further enhance the display capabilities of portable storage device 200. Some preferred embodiments further contain optional sensors 263 for measuring parameters such as amount of light, and movement of portable storage device 200. Using a light sensor enables display panel 230 to flash at a stronger brightness in the daytime and at a weaker brightness at night. In this context, a system clock that keeps track of time-of-day to distinguish between daytime and nighttime is considered a "light sensor". Using a movement sensor controller 215 may decide that the user is carrying the device around as an electronic ornament and increase the brightness of illumination accordingly.

A button 220 is optionally included in portable storage device 200 to switch the display functions of portable storage device 200 on and off in order to conserve energy. Moreover, button 220 may be used for indicating to controller 215 the flashing sequence option that controller 215 should operate under, for example to toggle between a hard-wired option and a sequence file 265. Optional button 220 can also be used as a "try me" button that activates the display configuration in a predetermined manner so that a user may view the featured display capabilities of portable storage device 200. This feature presents itself as a means of attracting a potential buyer in a store or as a means for the user to exhibit the visual capabilities of portable storage device 200 while portable storage device 200 is not connected to a host appliance 150

Figure 5:
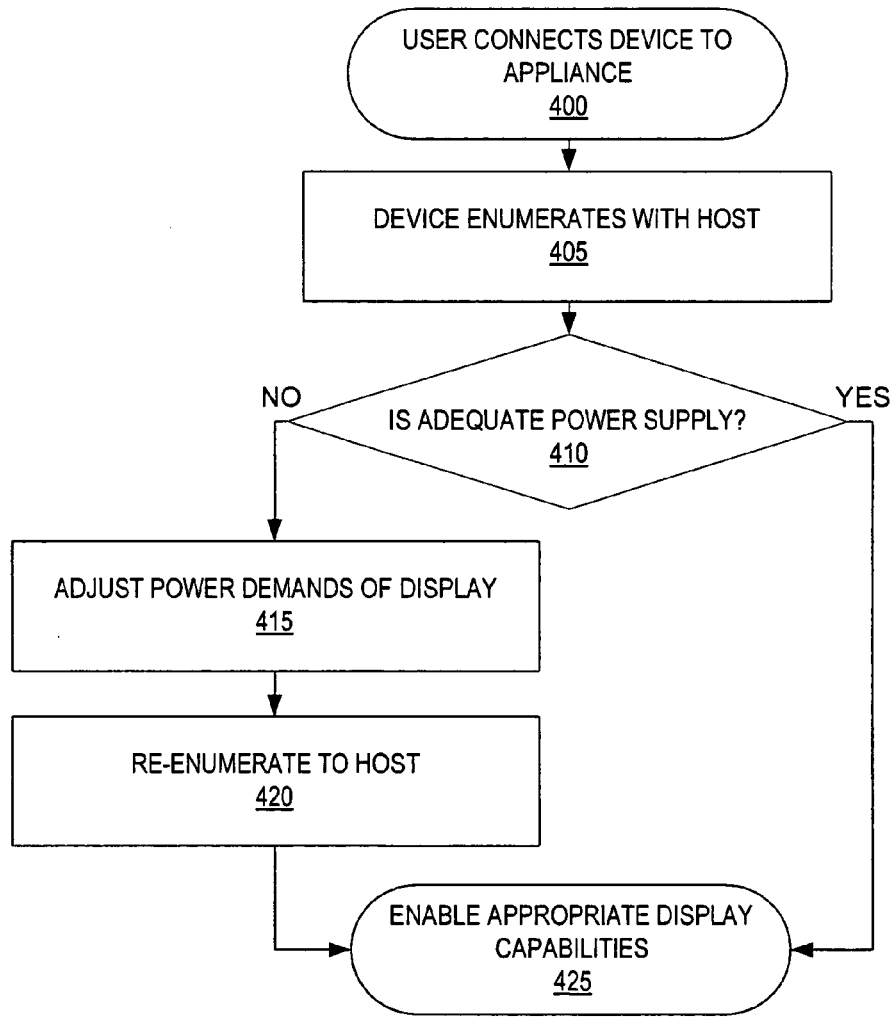
FIG. 5 is a flowchart of a method for power consumption adjustment in the storage device of FIG. 2.

Portable storage device 200 can use its ability to control display panel interface 225 as a method for controlling power consumption. This may be better understood with reference to FIG. 5, a flowchart of power consumption adjustment in a portable storage device 200. The user connects portable storage device 200 to appliance 150 (step 400). Portable storage device 200 reports its level of power consumption while enumerating with a USB host (step 405), the host system checks whether it can support the power consumption demands of portable storage device 200 (step 410) and if the system rejects the connection due to over current (in the case that the host port allows only a low power USB device) controller 225 decreases the power consumption level (step 415) by reducing the illumination brightness of display panel 230, lighting only part of the illumination segments, or even turning off display panel 230. Portable storage device 200 now re-enumerates (step 420) with a lower power consumption parameter, thus enabling a display capability that the host system can support (step 425).

Figure 2A:
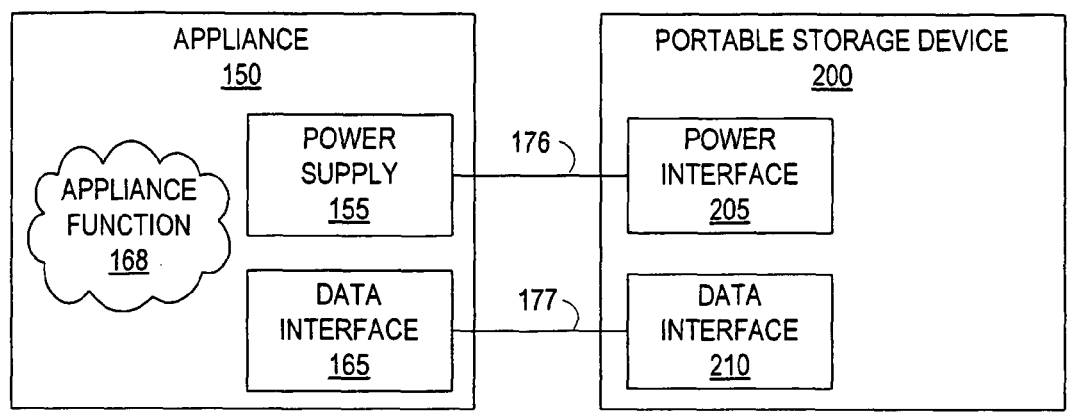
FIG. 2A is a schematic block diagram of the storage device of FIG. 2 connected to an appliance.
Figure 2B:
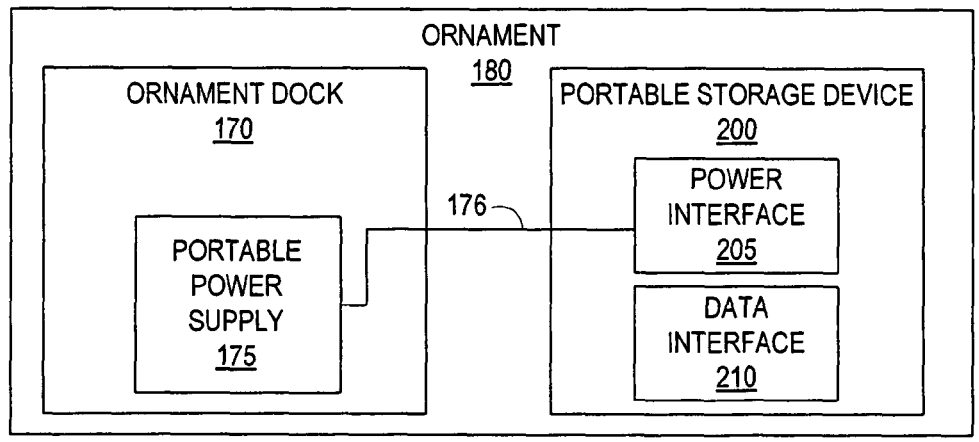
FIG. 2B is a schematic block diagram of the storage device of FIG. 2 connected to an ornament dock.

FIGS. 2A and 2B are schematic block diagrams showing portable storage device 200 alternately connected to an appliance 150 (FIG. 2A) and to an ornament dock 170 of an ornament 180 (FIG. 2B). Portable storage device 200 has a form factor that, on the one hand, is convenient to connect to an appliance 150 and, on the other hand, is convenient to connect to an ornament dock 170.

FIG. 2A is a schematic block diagram of portable storage device 200 connected to an appliance 150. Appliance 150 is a device, that is operatively connectable to a portable storage device 200. Examples of such an appliance 150 include a digital camera operatively connectable to a memory card 200 for storing images, or a computer of any form factor operatively connectable to a USB flash drive 200. When portable storage device 200 is operationally coupled with appliance 150, an electrical link 176 and a data link 177 are established. Portable storage device 200 is electrically connected to appliance 150 once electrical link 176 has been established between power interface 205 and power supply 155 in a similar manner to the establishment of electrical link 166 in the prior art (FIG. 1). Data link 177 is established between data interface 210 and data interface 165 in a similar manner to the way data link 167 established in the prior art (FIG. 1). Having established both links, portable storage device 200 is generally operable. As was mentioned above, "generally operable" implies that the device can perform its general purpose of reading, writing and erasing of data packages. Furthermore, the aforementioned advanced visual display capabilities are also functional under the prescribed mode of operation. The visual display exhibited by portable storage device 200 is determined according to the visual mode of operation as has been described in reference to FIG. 2. Appliance 150 may also use data interface 210 to pass to portable storage device 200 one or more commands dedicated to the operation of display panel 230. For example appliance 150 may pass a command which indicates the status of operation of appliance 150 itself, such as: if portable storage device 200 is connected to an appliance 150 that is a host computer, the computer may initiate a lighting sequence on portable storage device 200 if an e-mail has been received on the host computer. Another implementation using a host computer as appliance 150 allows the user to create new flashing sequences on the host appliance 150 and to test the new sequences on display panel 230 as the new sequences are created.

FIG. 2B shows portable storage device 200 operationally connected to an ornament dock 170. Ornament dock 170 has a form factor, such as a chain, a necklace, a wristwatch or a bracelet, that makes ornament dock 170 convenient for wearing and that allows ornament dock 170 to be connectable to portable storage device 200. Ornament dock 170 includes a portable power supply 175, such as a battery, to energize portable storage device 200. When portable storage device 200 is coupled to ornament dock 170 an electrical link 176 is established. Electrical link 176 is established between power interface 205 of portable storage device 200 and power supply 175 of ornament dock 170 in a manner similar to the establishment of electrical link 176 of FIG. 2A. When portable storage device 200 is connected to ornament dock 170 a data link is not established. Having established only link 176 without also establishing a data link, only the advanced visual display capabilities of portable storage device 200 are functional under the prescribed mode of operation. The visual image exhibited by portable storage device 200 is determined according to the visual mode of operation as has been described in reference to FIG. 2. Portable storage device 200 coupled with ornament dock 170 together form an electronic ornament 180. The integrated design of portable storage device 200 and ornament dock 170, together with the eye pleasing lighting of display panel 230, form the ornamental effect of electronic ornament 180. Since the power supply 175 of ornament dock 170 is not regularly connected to a power source, a method of renewing its power may be required. Such a method may be for power supply 175 to be a replaceable battery, thus by replacing a battery power is renewed, or by recharging power supply 175 via a recharging cable (not shown). An example of such an implementation is a USB cable, with both ends being A-Type plugs (which, according to the USB standard, supplies electrical energy from the respective appliance 150), may be inserted on one side to ornament dock 170 and on the other side to appliance 150, thus connecting appliance 150 and ornament dock 170 to recharge power supply 175. Alternatively, ornament dock 170 may have a USB plug (not shown) to be connected directly to an appliance 150 and to draw energy from power supply 155 of appliance 150.

Figure 6A:
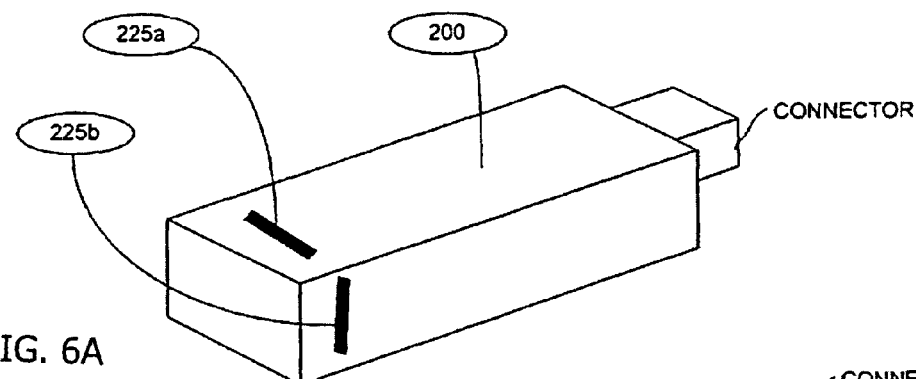
FIGS. 6A-6C are perspective views of a portable storage device of the present invention that can be positioned in several orientations relative to a host.
Figure 6B:
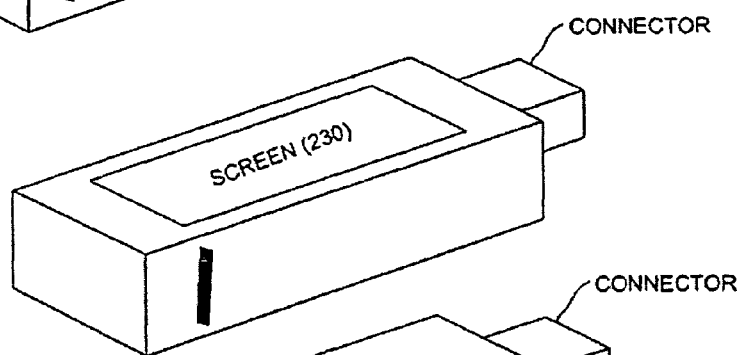
Figure 6C:
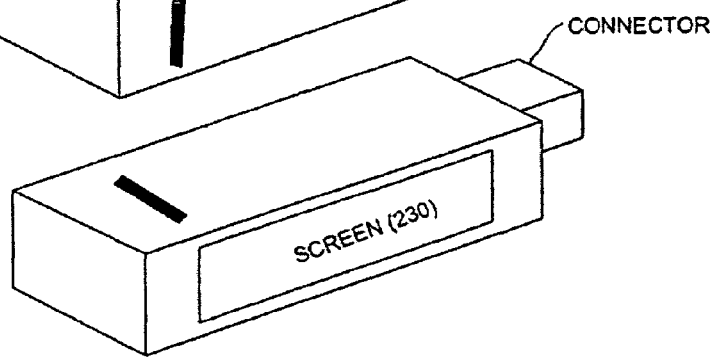

FIGS. 6A through 6C are perspective views of a portable storage device 200 that can be positioned in several orientations relative to a host. To this end, this portable storage device 200 includes four display panel interfaces, a display panel interface 225a on the top surface of device 200, a display panel interface 225b on a side surface of device 200, and two more display panel interfaces that are not visible in the Figures: one on the bottom surface of device 200 and one on the side surface of device 200 that is hidden from view. This portable storage device 200 is connected to its host via a USB connector that includes power interface 205 and data interface 210. FIG. 6B shows a display panel 230 operationally attached to display panel interface 225a. FIG. 6C shows a display panel 230 operationally attached to display panel interface 225b.

Figure 3:
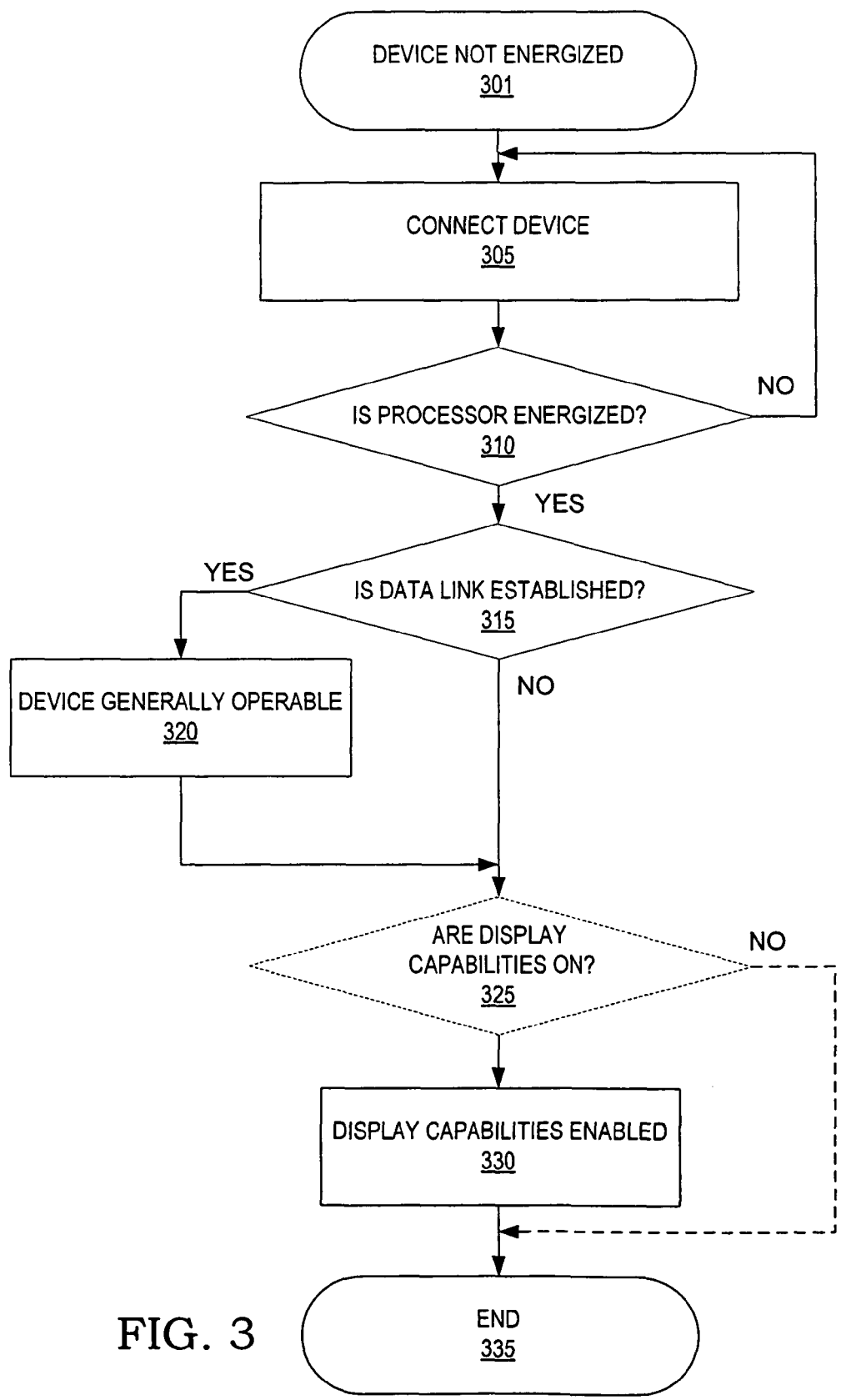
FIG. 3 is a flowchart of an exemplary workflow procedure of the storage device of FIG. 2.

FIG. 3 is a flowchart of the steps of a method for the operation of portable storage device 200. Reference also is made to FIGS. 2, 2A and 2B. The initial state of portable storage device 200 is that portable storage device 200 it is not energized (step 301). A decision is made to couple portable storage device 200 with another device (at step 305), which may be either ornament dock 170 or appliance 150. If, by the process of coupling, processor 215 has not been energized (step 310), meaning that electrical link 176 has not been established, the process awaits the connection to be made. Otherwise the processor has been energized and a check is made as to whether a data link 177 has been established (step 315). If data link 177 has been established (step 320), this means that portable storage device 200 is connected to appliance 150, and so is generally operable under these circumstances, meaning that portable storage device 200 can perform its main function of reading, writing and erasing data packages and also support the advanced display capabilities of portable storage device 200. In the case that data link 177 has not been established as is the case when portable storage device 200 is connected to ornament dock 170, or alternatively in continuation to step 320, the procedure proceeds with optional step 325, which is dependent on whether portable storage device 200 has button 220, and wherein a check is made as to whether display capabilities are turned on by button 220. If the display capabilities are on, or if there is no button 220 at all, storage device 220 operates display capabilities (step 330), functioning under the prescribed mode of operation, and the procedure proceeds to the end of the process (step 335). Otherwise the process ends at step 335 without the implementing of display capabilities. This method may be implemented by setting the logical state of the interface of ornament dock 170 to be one that is different from the standard logical state for a USB host for example by forcing the logical level of the data connectors to be low. Portable storage device 220, upon identifying that the logical state is non-standard, assumes that it is connected to an ornament dock 170 and acts accordingly by implementing only the advanced display capabilities of portable storage device 200 and not attempting to make portable storage device 200 generally operable. It should be appreciated by those skilled in the art that the method of operation herein described is exemplary.

While the invention has been described with respect to a limited number of embodiments, it will be appreciated that many variations, modifications and other applications of the invention may be made.

What is claimed is:

1. A peripheral device comprising:
a display panel interface, the display panel interface includes only one physical connector;
a controller included in said peripheral device; and
a plurality of display panels for the peripheral device that are individually and operationally attachable to and detachable from the only one physical connector of said display panel interface such that all of the plurality of display panels are attachable to the only one physical connector and only one display panel can be connected to the only one physical connector at a time, each of said display panels being operative to display information about a different respective function of operation being performed on and by the peripheral device while attached to the only one physical connector of the peripheral device, each of said display panels being directly driven by the controller in said peripheral device via the display panel interface while attached to the one physical connector of the peripheral device.

2. The peripheral device of claim 1, further comprising:
a power interface for receiving power, from a host of the peripheral device, for powering one of said display panels via said display panel interface; and
a mechanism on said peripheral device for toggling between a first state in which said display panel uses said power and a second state in which said display panel does not use said power.

3. The peripheral device of claim 2, further comprising:
a non-volatile memory; and
a data interface for exchanging data between said host and said non-volatile memory, data can be exchanged between the host and the non-volatile memory via said data interface in more than one security level, said one of said displays panels visually indicates the security level for data that is being transferred between said host and said non-volatile memory.

4. The peripheral device of claim 1, further comprising:
a power interface for receiving power for said one of said display panels and for said controller from a host, the peripheral device is attachable to and detachable to the host, operation of said one of said display panels is intentionally changed from one operational condition to another operational condition based an indication about power from the host, said one operational condition and said another operational condition are in addition to a state of being off.

5. The peripheral device of claim 1, wherein:
instruction sets for each display panel are programmed into the controller as part of a library of instruction sets for the plurality of display panels.

6. The peripheral device of claim 1, wherein:
instruction sets for the display panels are embedded in the display panels and read by the controller via the display panel interface.

7. The peripheral device of claim 1, wherein:
the peripheral device include s a portable storage device;
one of the display panels displays information about free storage space available in the portable storage device; and
a different display panel displays direction of data communication for the peripheral device.

8. A peripheral device comprising:
a display panel interface, the display panel interface includes only one physical connector;
a plurality of display panels that are individually attachable to and removable from said only one physical connector of said display panel interface, each of said display panels are separately attachable to and detachable from said only one physical connector such that only one display panel at a time can be connected to said only one physical connector of said display panel interface, each of said display panels displays information about a different function performed on and by said peripheral device than the other display panels while attached to the only one physical connector of said peripheral device; and
a controller separately operating each of the display panels while attached to the only one physical connector of said peripheral device instruction sets for each display panel are programmed into the controller as part of a library of instruction sets for the plurality of display panels.

9. The peripheral device of claim 8, further comprising:
a power interface for receiving power for said one of said display panels and for said controller from a host, the peripheral device is attachable to and detachable to the host, operation of said one of said display panels is intentionally changed from one operational condition to another operational condition based an indication about power from the host, said one operational condition and said another operational condition are in addition to a state of being off.

10. A peripheral device comprising:
a display panel interface, the display panel interface includes only one physical connector;
a plurality of display panels that are individually attachable to and removable from said only one physical connector of said display panel interface, each of said display panels are separately attachable to and detachable from said only one physical connector such that only one display panel at a time can be connected to said only one physical connector of said display panel interface, each of said display panels displays information about a different function performed on and by said peripheral device while attached to the only one physical connector of said peripheral device; and
a controller separately operating each of the display panels while attached to the only one physical connector of said peripheral device, instruction sets for the display panels are embedded in the display panels and read by the controller via the display panel interface.

* * * * *